United States Patent
Reiherzer et al.

(10) Patent No.: US 10,797,204 B2
(45) Date of Patent: Oct. 6, 2020

(54) SUBMOUNT BASED LIGHT EMITTER COMPONENTS AND METHODS

(71) Applicant: Cree, Inc., Durham, NC (US)

(72) Inventors: Jesse Colin Reiherzer, Wake Forest, NC (US); Erin R. F. Welch, Ann Arbor, MI (US); Sung Chul Joo, Cary, NC (US)

(73) Assignee: Cree, Inc., Durham, NC (US)

( * ) Notice: Subject to any disclaimer, the term of this patent is extended or adjusted under 35 U.S.C. 154(b) by 243 days.

(21) Appl. No.: 14/292,244

(22) Filed: May 30, 2014

(65) Prior Publication Data

US 2015/0345714 A1    Dec. 3, 2015

(51) Int. Cl.

| | |
|---|---|
| *H01L 33/50* | (2010.01) |
| *F21V 13/02* | (2006.01) |
| *F21V 23/00* | (2015.01) |
| *H01L 33/60* | (2010.01) |
| *H01L 23/00* | (2006.01) |
| *H01L 33/48* | (2010.01) |
| *H01L 25/075* | (2006.01) |

(52) U.S. Cl.
CPC ............. *H01L 33/50* (2013.01); *H01L 24/97* (2013.01); *H01L 33/486* (2013.01); *H01L 33/60* (2013.01); *H01L 25/0753* (2013.01); *H01L 2224/48091* (2013.01); *H01L 2224/48137* (2013.01); *H01L 2224/48227* (2013.01); *H01L 2224/49113* (2013.01); *H01L 2924/1815* (2013.01); *Y10T 29/49131* (2015.01)

(58) Field of Classification Search
CPC ......... F21K 9/50; H01L 33/50; H01L 33/486; H01L 33/60; H01L 25/0753; H01L 2224/48137; H01L 2924/1815
USPC .......................................................... 362/84
See application file for complete search history.

(56) References Cited

U.S. PATENT DOCUMENTS

| | | |
|---|---|---|
| 6,515,313 B1 | 2/2003 | Ibbetson et al. |
| 6,600,175 B1 | 7/2003 | Baretz et al. |
| 6,958,497 B2 | 10/2005 | Emerson et al. |
| 7,213,940 B1 | 5/2007 | Van de Ven |
| 7,312,474 B2 | 12/2007 | Emerson et al. |
| 7,446,345 B2 | 11/2008 | Emerson et al. |
| 7,692,182 B2 | 4/2010 | Bergmann et al. |
| 7,692,209 B2 | 4/2010 | Edmond et al. |
| 7,791,061 B2 | 9/2010 | Edmond et al. |
| 8,039,859 B2 | 1/2011 | Leung et al. |
| 7,943,945 B2 | 5/2011 | Baretz et al. |
| 7,943,952 B2 | 5/2011 | Loh et al. |
| 8,167,463 B2 | 5/2012 | Loh |
| 8,502,247 B2 | 8/2013 | Baretz et al. |
| 8,608,349 B2 | 12/2013 | Loh |

(Continued)

Primary Examiner — Karabi Guharay
(74) Attorney, Agent, or Firm — Jenkins, Wiison, Taylor & Hunt, P.A.

(57) ABSTRACT

Submount based light emitter components and related methods are disclosed. In some aspects, light emitter components include a reflective ceramic submount, at least one light emitter chip disposed over a first surface of the submount, a layer of optical conversion material disposed over portions of each of the at least one light emitter chip and the first surface of the submount, and a lens disposed over the layer of optical conversion material. The layer of optical conversion material and the lens define separate and discrete layers over the at least one light emitter chip and submount.

30 Claims, 10 Drawing Sheets

(56) References Cited

U.S. PATENT DOCUMENTS

| | | |
|---|---|---|
| 8,622,582 B2 | 1/2014 | Loh |
| 8,659,034 B2 | 2/2014 | Baretz et al. |
| 8,669,573 B2 | 3/2014 | Medendorp et al. |
| D712,850 S | 9/2014 | Welch et al. |
| 8,866,169 B2 | 10/2014 | Bernstein et al. |
| 8,895,998 B2 | 11/2014 | Hussell et al. |
| 8,896,008 B2 | 11/2014 | Donofrio |
| D721,339 S | 1/2015 | Hussell et al. |
| 8,957,430 B2 | 2/2015 | Donofrio |
| 9,000,470 B2 | 4/2015 | Tudorica et al. |
| RE45,517 E | 5/2015 | Doverspike et al. |
| 9,054,253 B2 | 6/2015 | Bergmann et al. |
| 9,070,850 B2 | 6/2015 | Keller et al. |
| 9,105,824 B2 | 8/2015 | Heikman et al. |
| 9,112,083 B2 | 8/2015 | Emerson et al. |
| D738,832 S | 9/2015 | Hussell et al. |
| 9,159,888 B2 | 10/2015 | Chitnis et al. |
| 2008/0258130 A1 | 10/2008 | Bergmann et al. |
| 2009/0114932 A1* | 5/2009 | Chou ................ F21V 29/507 257/89 |
| 2011/0163338 A1* | 7/2011 | Won .................. H01L 33/46 257/98 |
| 2011/0211334 A1* | 9/2011 | Kim .................. H01L 33/54 362/84 |
| 2012/0300431 A1* | 11/2012 | You .................. H01L 25/0753 362/84 |
| 2013/0264591 A1* | 10/2013 | Hussell ...................... 257/88 |
| 2013/0322070 A1* | 12/2013 | Clark et al. ............. 362/235 |
| 2013/0329425 A1* | 12/2013 | Lowes et al. ........... 362/235 |

\* cited by examiner

SUBMOUNT BASED LIGHT EMITTER COMPONENTS AND METHODS

TECHNICAL FIELD

The subject matter disclosed herein relates generally to light emitter components and methods. More particularly, the subject matter disclosed herein relates to submount based components and related methods.

BACKGROUND

Light emitting diodes (LEDs) or LED chips are solid state devices that convert electrical energy into light. LED chips can be utilized in light emitter components or packages for providing different colors and patterns of light useful in various lighting and optoelectronic applications. Light emitter components can include surface mount devices (SMDs) which can be mounted directly onto the surface of an underlying circuit component or heat sink, such as a printed circuit board (PCB) or metal core printed circuit board (MCPCB). Conventional SMDs include a leadframe molded in plastic with leads extending or protruding from the plastic body, where the leads are configured to directly mount to the underlying circuit component. SMDs can be used in various LED light bulb and light fixture applications and are developing as replacements for incandescent, fluorescent, and metal halide high-intensity discharge (HID) lighting applications.

Manufacturers of LED lighting products are constantly seeking ways to reduce their cost in order to provide a lower initial cost to customers, and encourage the adoption of LED products. Components incorporating fewer raw materials at sustained or increased brightness levels using the same or less power are becoming more desirable.

Conventional SMD light emitter components utilize one or more LED chips mounted within a component body. Typically, the component body is molded about electrical contacts or leads. Individually molding component bodies about leadframes and forming reflector cavities can be both expensive and time-consuming. In addition, molded bodies require one or more coatings of additional materials for high reflectivity.

Thus, despite the availability of various SMD light emitter components in the marketplace, a need remains for improved SMD components and methods of providing highly reflective components, utilize fewer raw materials, and which can be produced quickly, efficiently, and at a lower cost. Such components can make it easier for end-users to justify switching to LED products from a return on investment or payback perspective.

SUMMARY

In accordance with this disclosure, submount based light emitter components and methods having improved manufacturability, high light reflectivity, and that are optionally customizable are provided and described herein. Components and methods described herein can advantageously exhibit improved processing times, ease of manufacture, and/or lower processing costs. Components described herein can be batch processed over a panel and well suited for a variety of applications such as personal, industrial, and commercial lighting applications including, for example, light bulbs and light fixture products and/or applications.

In some aspects, components described herein can comprise a highly reflective submount and a discrete phosphor layer contributing to a lower overall cost of manufacture and improved thermal dissipation from the reflective submount. It is, therefore, an object of the present disclosure to provide light emitter components and methods that are submount based, in some aspects, by allowing a multitude of different, customized components to be provided over a panel, without incurring the expense of custom fabricated packages.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
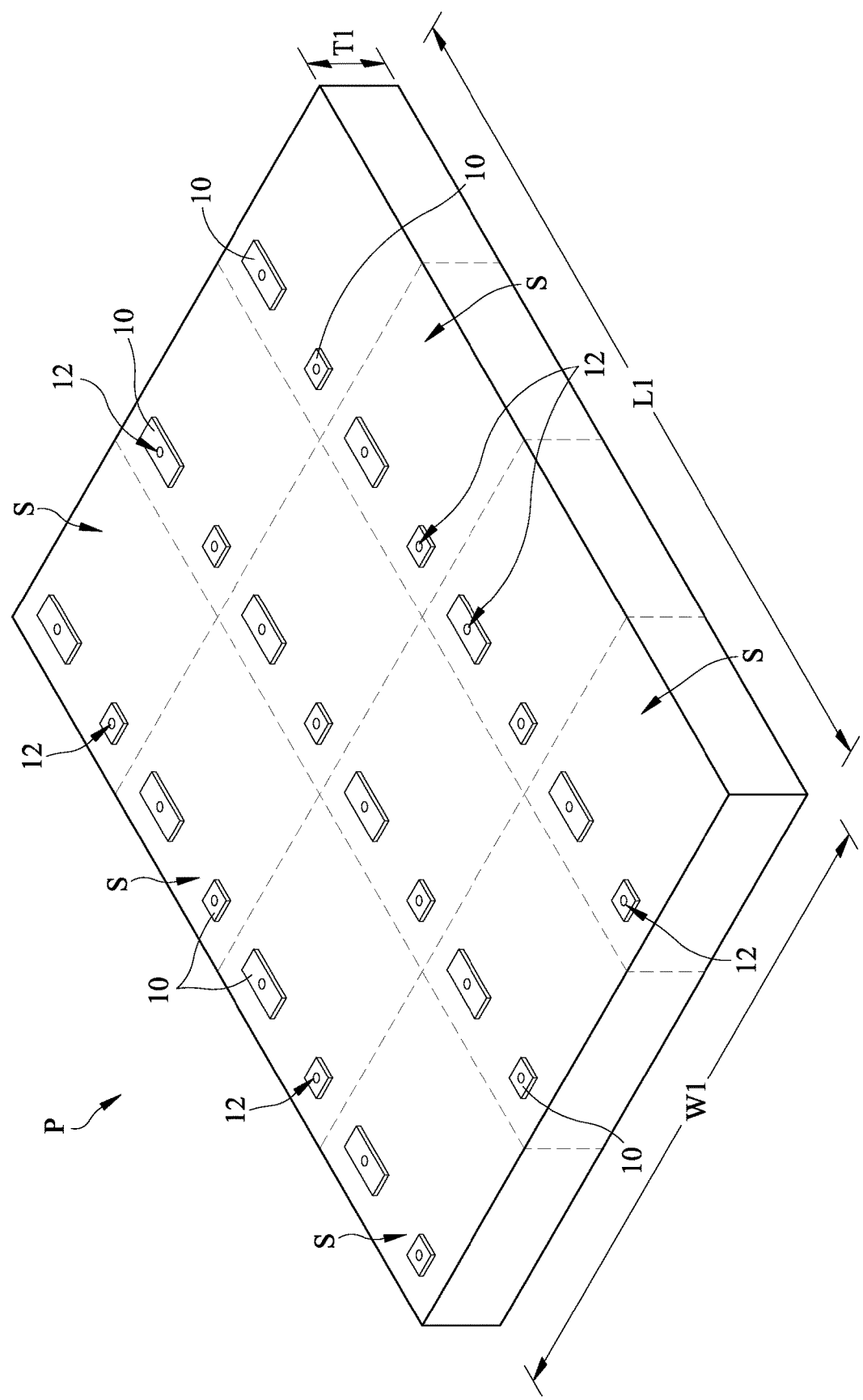
FIGS. 1A to 1C are perspective views illustrating a panel of light emitter components, or portions thereof, prior to singulation, according to the disclosure herein.

The subject matter disclosed herein is directed to submount based light emitter components and methods, such as submount based light emitting diode (LED) components and methods. In some aspects, the light emitter components and methods can be a surface mount design (SMD), but the disclosure herein is not limited to SMDs. Components and methods provided herein can exhibit improved manufacturability, improved brightness, and improved light extraction per component via improved reflectivity, as well as allowing for customized components for supporting LED chips and allowing electrically connectivity thereof, without incurring the expense associated with custom fabricated ceramic or plastic packages.

Notably, individual submounts of submount based light emitter components can be singulated from a larger panel of material, for example, a highly reflective ceramic substrate, and allow for a plurality of different and/or customized components to be formed thereon. In some aspects, light emitter components and methods described herein exhibit improved manufacturability and improved reflection of light. The novel emitter components according to the disclosure herein can further comprise a discrete non-molded phosphor layer and a discrete molded optical element for improving thermal management within components according to the disclosure herein.

The light emitter components can be formed over a highly reflective panel and batch processed prior to singulation from the panel, thereby improving manufacturability. In some aspects, light emitter components described herein can comprise non-metallic submount material(s) that is/are substantially reflective and substantially non-absorbing of light emitted by one or more LED chips. In some aspects, any amount light which penetrates the submount becomes reflected back out via reflective particles, porosity, and/or grain boundaries of the submount material.

In some aspects, light emitter components according to the disclosure herein comprise electrical contacts or traces, each of which has a minimized surface area with respect to a surface area of submount. This reduces absorption, blockage, and/or other adverse interference with light by the metallic traces. In some aspects, the metallic traces are spaced apart from one or more light emitter chips (e.g., LED chips) and are disposed proximate the outermost edges of the submount for reducing interference with, absorption of, and/or potential blockage of light. Minimizing the surface area of traces also advantageously allows more light to be reflected from the highly reflective panel or submount.

In some aspects, a total amount of combined surface area for the one or more metallic traces or electrical contacts of components according to the disclosure herein can be less than or approximately equal to 10% of the overall surface area of the top surface of the submount, less than or approximately equal to 7% of the top surface area of the submount, or less than or approximately equal to 5% of the top surface area of the submount. In some aspects, an overall and total amount of combined LED chip surface area of components according to the disclosure herein can be less than or approximately equal to 45% of the overall surface area of the top surface of the submount, less than or approximately equal to 35% of the top surface area of the submount, or less than or approximately equal to 20% of the top surface area of the submount.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene.

References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the component in addition to the orientation depicted in the figures. For example, if the component in the figures is turned over, structure or portion described as "above" other structures or portions would now be oriented "below" the other structures or portions. Likewise, if components in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein, the terms "through-hole", "thru-hole", and/or "via" are synonymous and refer an opening in the submount, often filled and/or lined (e.g., along one or more side walls) with an electrically conductive material that allows for an electrically conductive conduit or pathway between different layers, surfaces, or features of the component.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

Light emitter components according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In some aspects sapphire chips are utilized in components disclosed herein, as sapphire chips comprise a reflective mirror layer, thereby further improving reflectivity of light from the light emitter component.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB.

Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips can be at least partially coated with one or more phosphors. The phosphors can absorb a portion of light from the LED chip and emit light at a different wavelength such that the light emitter component emits a combination of light from each of the LED chip and the phosphor. In one embodiment, the light emitter component emits what is perceived as white light resulting from a combination of light emission from the LED chip and the phosphor. In one embodiment according to the present subject matter, white emitting components can consist of an LED chip that emits light in the blue wavelength spectrum and a phosphor that absorbs some of the blue light and re-emits light in the green, yellow, and/or red wavelength spectrum. The components can therefore emit a white light combination across the visible spectrum of light. In other embodiments, the LED chips can emit a non-white light combination of blue and yellow light as described in U.S. Pat. No. 7,213,940. LED chips emitting red light or LED chips covered by a phosphor that absorbs LED light and emits a red light are also contemplated herein.

In some aspects, light emitter components herein comprise a non-dispensed phosphor layer. The phosphor layer can be sprayed, coated, or otherwise applied as a discrete layer over LED chips and/or portions of the wirebonds. The phosphor is not dispersed and/or uniformly dispensed within a molded lens or encapsulant. The discrete phosphor layer provided over the LED chips can improve thermal management within components, as it can trap or confine heat close to the submount.

It is understood that light emitter components and methods according to the present subject matter can also have multiple LED chips of different colors, one or more of which can be white emitting.

FIGS. 1A through 3B illustrate embodiments of submount based light emitter components and related methods according to the present subject matter as disclosed and described herein. In some aspects, the submount based light emitter components comprise SMD components, adapted for connection to portions of a circuit, circuitry, heat sink, and/or other electrically or thermally conductive surfaces. The SMD components are devoid of costly leadframe and molded or dispensed phosphor.

Figure 1B:
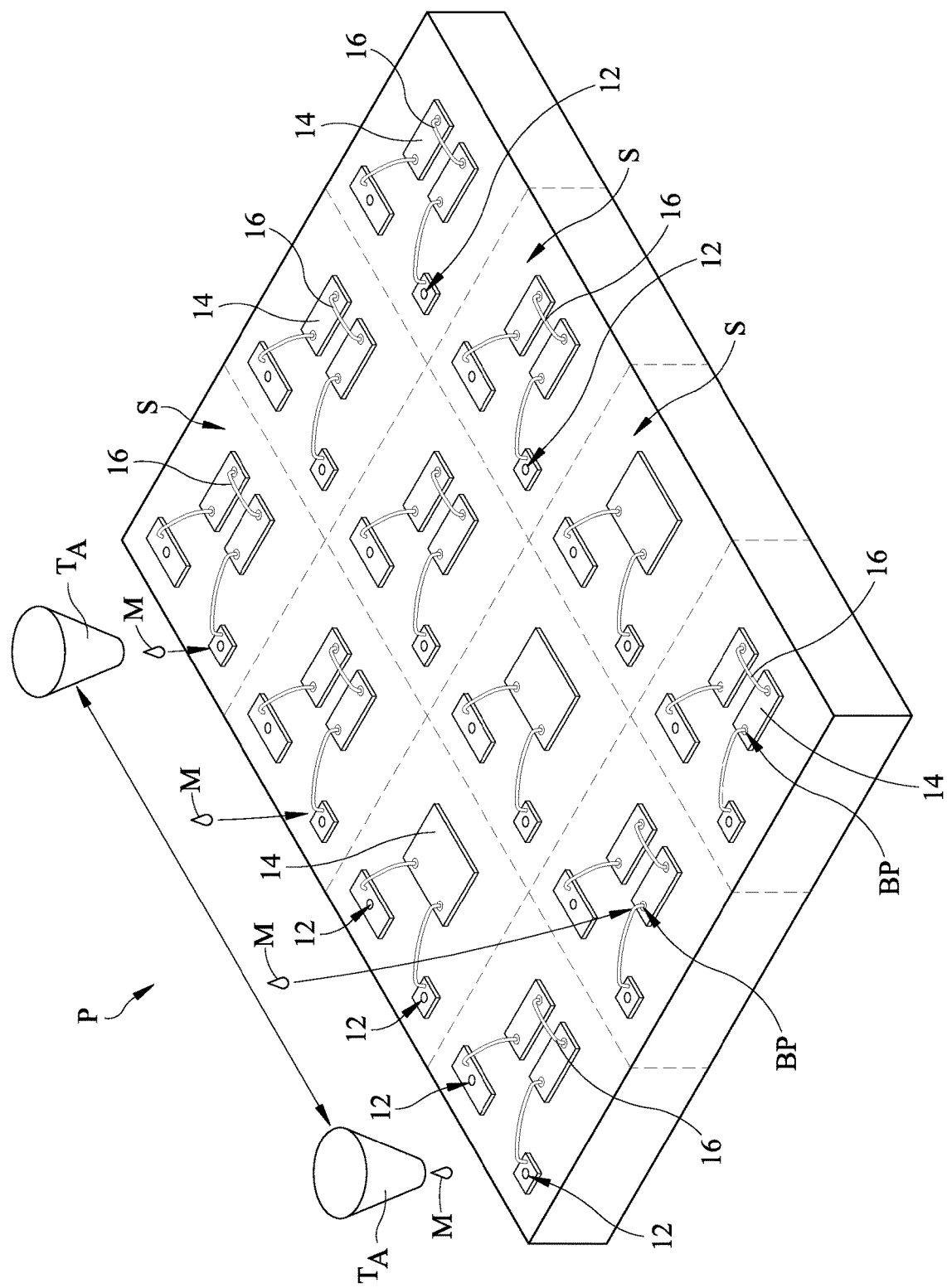
Figure 1C:
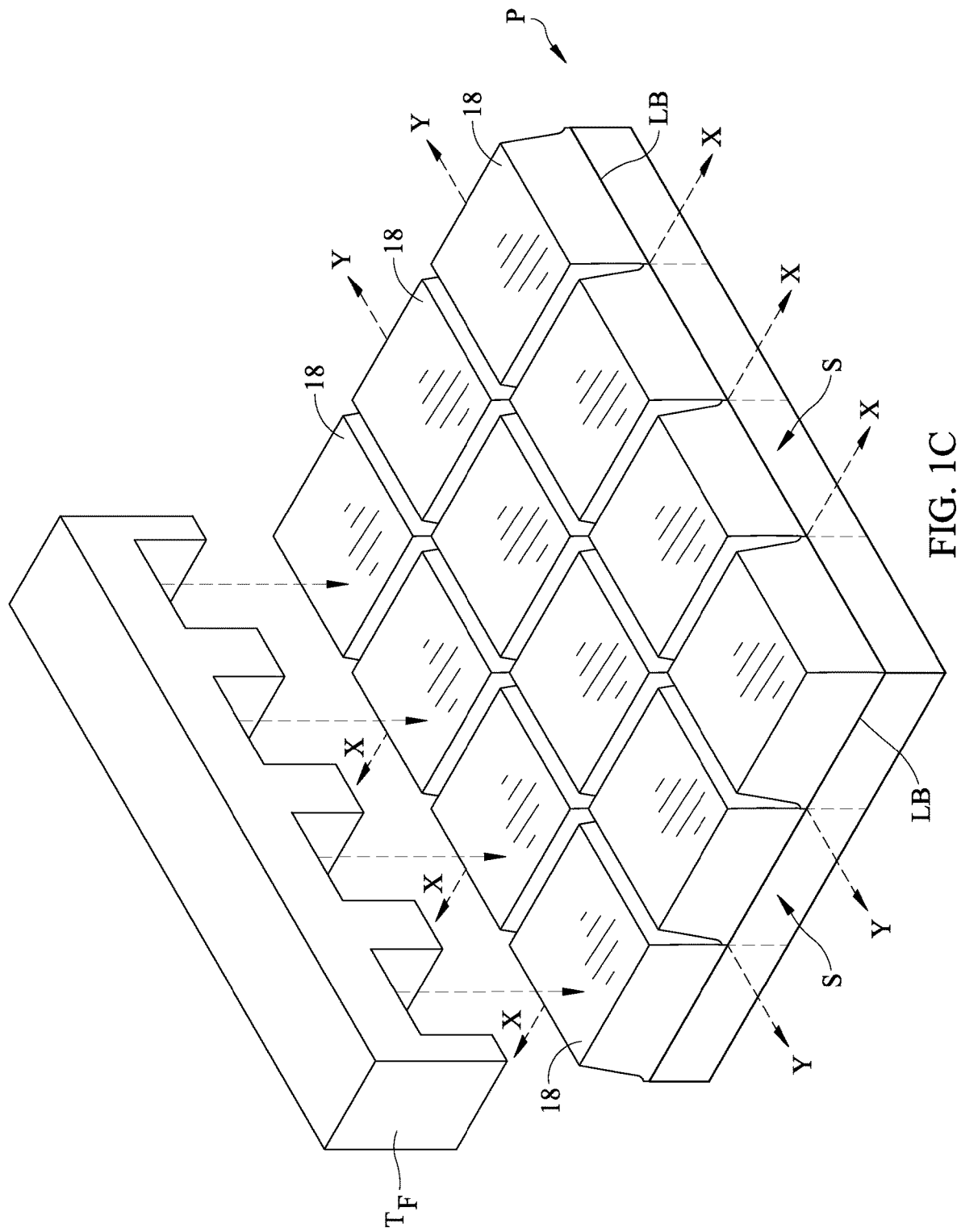

FIGS. 1A to 1C illustrate a portion of a substrate or panel, generally designated P, from which one or more individual submount based light emitter components (e.g., 30, FIGS. 2A to 2L) can be singulated, separated, and/or otherwise physically isolated. That is, one or more individual submounts, generally designated S can be singulated from panel P. In some aspects, a plurality of submount based SMD light emitter components (e.g., 30, FIGS. 2A to 2L) can be formed and/or batched processed over panel P prior to singulation. The components can then be sorted and shipped to customers or consumers based upon electrical and/or optical properties. In some aspects, panel P and submount portions thereof form the building blocks for the novel light emitter components herein, as bright customized components having improved thermal management can easily be provided over panel P.

In some aspects, panel P comprises a substrate comprising a length L1 of approximately 4 inches (") and a width W1 of approximately 2" (e.g., 4"×2") such that approximately 420 emitter components with individual submounts S having lengths and/or widths of approximately 3.5 mm×3.5 mm or more/less can be formed thereon and/or singulated therefrom. For illustration purposes, the broken lines in FIGS. 1A to 1C are included for illustrating lines along which panel P can later be sub-divided, such that a plurality of light emitter components having a plurality of submounts S may be singulated therefrom. In other aspects, panel P is approximately 5 inches (") in length L1 and/or width W1, approximately 4" in length L1 and/or width W1, approximately 3" in length L1 and/or width W1, or approximately 2" in length L1 and/or width W1. However, any size and/or shape of panel P can be provided.

In some aspects, any size and/or number of light emitter components can be formed upon, batch processed over, and singulated from panel P. Each light emitter component (e.g., 30, FIGS. 2A to 2L) can comprise an individual submount S that is larger or smaller than approximately 3.5 mm per side (i.e., 10 mm per side; 8 mm per side; 7 mm per side, 4 mm per side, 3 mm per side, 2 mm per side, or less than 2 mm per side). Non-rectangular and non-square panels P, submounts S, and/or respective light emitter components can also be provided.

In some aspects, panel P can further comprise any height or thickness T1 between approximately 0.3 mm and 2.0 mm. For example, in some aspects, panel P has a thickness T1 of approximately 1 mm or less, approximately 0.8 mm or less, or approximately 0.5 mm or less. In some aspects, panel P is approximately 0.6 mm thick. In other aspects, panel P is approximately 0.35 mm thick or more. As noted above, any size and/or shape of panel P can be provided.

In some aspects, panel P comprises a non-metallic material, such as a white, silver, or substantially transparent and reflective ceramic based material for improving light extraction and reflectance. Panel P can comprise a highly reflective aluminum oxide (e.g., alumina or $Al_2O_3$), aluminum nitride (AlN), or zirconia ($ZrO_2$) panel with or without additional reflective particles dispersed therein. In some aspects, porosity, particles, and/or grain boundaries within ceramic panel P advantageously reflect light. Panel P can comprise a powder based (e.g., "green") ceramic that is pressed and fired prior to attachment of one or more LED chips (14, FIG. 1B). Panel P can comprise at least one substantially flat or planar surface over which the one or more LED chips (14, FIG. 1B) can be supported, mounted, and/or attached. Panel P and submounts S can comprise reflective particles such as for example those selected from the group consisting of titanium dioxide ($TiO_2$), zinc peroxide ($ZnO_2$), silicone dioxide ($SiO_2$), or zirconia ($ZrO_2$) particles Notably, light emitter components disclosed herein can be batch formed and/or batch processed, to thereby simultaneously form a plurality of customized packages that are submount based and can be provided at lowered costs and/or have improved manufacturability. For example, panel P can be provided with customized light emitters (e.g., customized size, shape, color, number, and/or connectivity of LED chips), traces (e.g., customized size, shape, and/or placement thereof), reflectors (e.g., customized size, shape, material, color, placement thereof), and/or optical elements (e.g., customized shape, size, placement, dome height, etc.) prior to singulation into individual light emitter components. Aspects of the LED chips, traces, and/or optical elements can be customized to provide light emitter components operable at various electrical and/or optical specifications per customer and/or consumer requests.

In some aspects, panel P is highly reflective to visible light (e.g., greater than about 90%), and provides conduction of heat as well as mechanical support. In some aspects, non-metallic and/or ceramic materials containing $Al_2O_3$ or zirconia ($ZrO_2$) exhibit such desirable qualities. Accordingly, panel P, and submounts S singulated therefrom, can comprise a ceramic based body of material comprising $Al_2O_3$ or $ZrO_2$. Panel P can comprise $Al_2O_3$ with or without reflective particles, such as $ZrO_2$ particles. In some aspects, panel P comprises a highly reflective $Al_2O_3$ having a density of approximately 3.75 $g/cm^3$ or less. In other aspects, panel P comprises a highly reflective $ZrO_2$ having a density of approximately 4.0 $g/cm^3$ or less.

In some aspects, panel P can comprise a ceramic body that can be cast from low temperature co-fired ceramic (LTCC) materials or high temperature co-fired ceramic (HTCC) materials and related processes. In one embodiment, panel P can be cast from a thin green ceramic tape and subsequently fired. Where used, the ceramic tape can comprise any ceramic filler material known in the art, for example, panel P can comprise a glass ceramic, such as $Al_2O_3$ or aluminum nitride (AlN) having 0.3 to 0.5 weight percent of glass frits. The glass frits can be used as a binder and/or sintering inhibitor within the ceramic tape when the tape is fired.

In some aspects, the green ceramic tape can be formed by casting a thick layer of a slurry dispersion of the glass frit, ceramic filler, one or more additional binders, and a volatile solvent. The cast layer can be heated at low temperatures to remove the volatile solvent. Green ceramic tape panels P can advantageously comprise any thickness desired, thus contributing to a thinner size, where desired.

As noted above, panel P can further comprise any of a variety of light scattering particles contained therein. Examples of suitable scattering particles can for example comprise particles of $Al_2O_3$, $TiO_2$, $BaSO_4$, $ZrO_2$, and/or AlN. Panel P can be produced by thin- or thick-film processing techniques available at and including products available from CoorsTek, headquartered in Golden, Colo. Such panels P can optionally be fired along with other materials (e.g., $ZrO_2$) to further improve optical and mechanical properties. LED chips 14 can be mounted to the panel P after firing and/or sintering thereof.

In some aspects, panel P is similar to and/or provided using methods described in U.S. utility patent application Ser. No. 11/982,275, filed Oct. 31, 2007 and/or U.S. utility patent application Ser. No. 12/757,891, filed Apr. 9, 2010. The entire contents of each of these references are hereby incorporated by reference herein.

Still referring to FIG. 1A, a plurality of electrical contacts, such as electrically conductive traces 10, can be provided over a first surface of panel P. SMD pads or contacts (e.g., 38, 40, FIG. 2B) can be provided over a second, opposing surface of panel P. Top contacts (e.g., 10) and bottom contacts (e.g., 38, 40, FIG. 2B) can electrically communicate by passing current along one or more electrically conductive through holes or vias, generally designated 12.

In some aspects, the plurality of traces 10 comprises a plurality of pairs of electrical contacts (e.g., anode/cathode pairs) for supplying current to LED chips (14, FIG. 1B). Traces 10 comprise areas of electrically conductive material, such as metal or a metal alloy, disposed over panel P. Traces 10 can be provided along a top side or surface of panel P via sputtering, electroplating, electroless plating, depositing (e.g., chemical, plasma, vapor, and/or physical deposition), lithography processing, photoresist processing, stenciling, and/or any other suitable process or technique. Traces 10 can be thin, and can optionally comprise one or more layers of material. Traces 10 can be, but do not have to be, disposed proximate outermost areas of submounts formed from panel P. The surface area of each trace 10 is minimized, such that the combined surface area of the total number of traces is approximately 10% or less than the total, overall surface area of submount (e.g., L2×W2, FIG. 2B).

In some aspects, the size, shape, number, location, thickness, and/or material of traces 10 can be customized for use in various lighting applications.

The surface area of traces 10 is minimized with respect to the surface area of panel P and respective submounts S for providing components having improved reflection of light. When the surface area of traces 10 is minimized, there is more surface area over each submount S available for reflecting light, as the submount S is the primary reflector of light emitter components described herein. Traces 10 are small, for example, wherein at least one side (e.g., the length or width) is approximately 500 µm or less, approximately 400 µm or less, or approximately 300 µm or less. Non-square and non-rectangular traces 10 can also be provided.

Figure 2A:
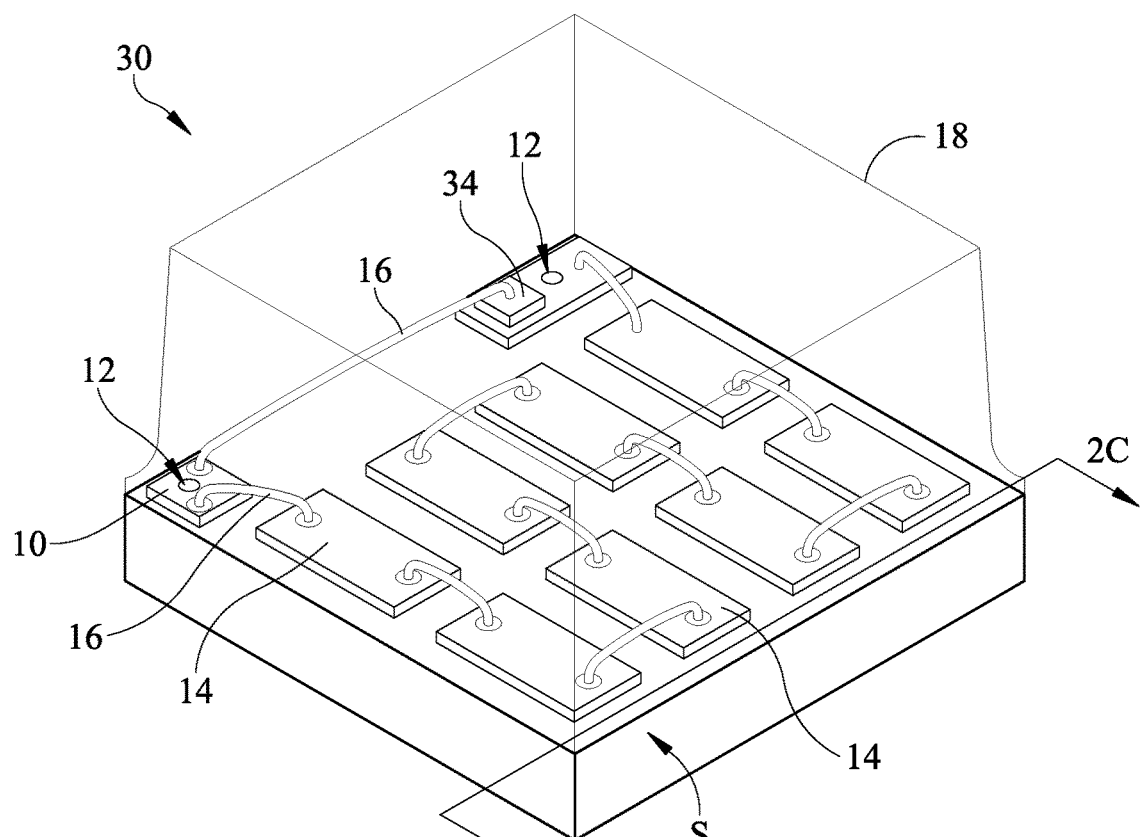
FIG. 2A is a perspective top view illustrating a singulated submount based light emitter component according to the disclosure herein.
Figure 2B:
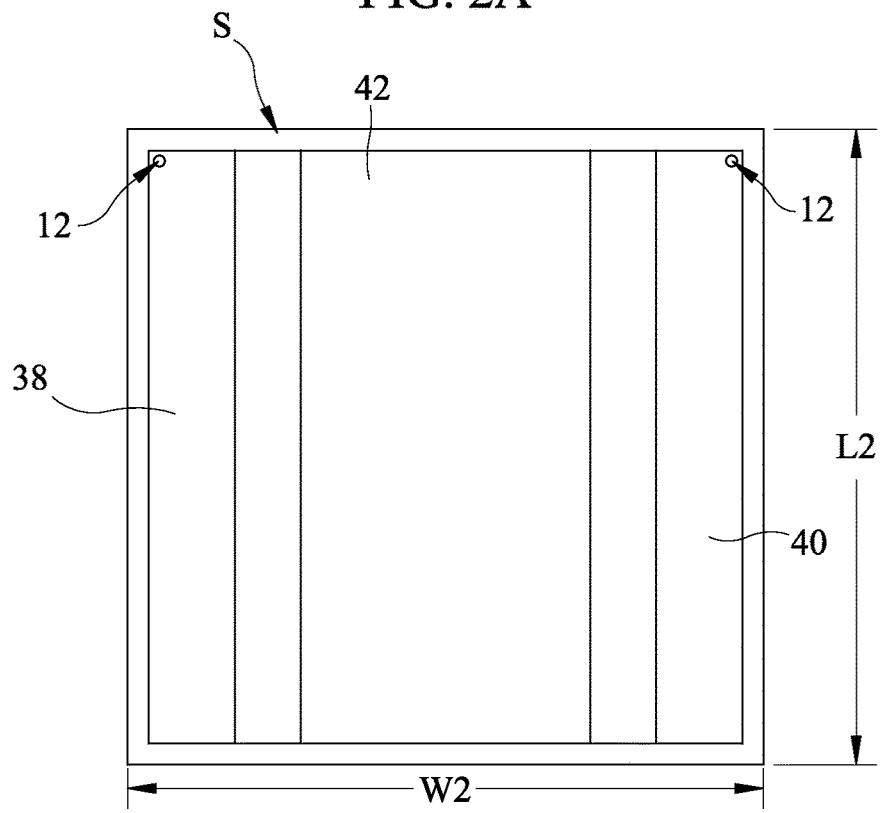
FIG. 2B is a bottom view illustrating a singulated submount based light emitter component according to the disclosure herein.

A plurality of electrically conductive vias 12 can be provided within portions of panel P and extend between upper traces 10 and lower contacts (e.g., SMD contacts 38, 40, FIG. 2B). Traces 10 can be plated or otherwise deposited over portions of vias 12. Vias 12 can comprise openings, apertures, and/or holes extending through and/or internally within panel P. Vias 12 can be, but do not have to be, vertically aligned or parallel with respect to the vertical axis of panel thickness T1.

In some aspects, vias 12 are filled and/or plated with electrically conductive material, such that top contacts or traces 10 can electrically communicate with bottom contacts or traces (e.g., 38 and 40, FIG. 2B). Bottom traces (e.g., 38 and 40, FIG. 2B) can be attached on a back side of panel P, which opposes the surface upon which LED chips 14 are provided. A plurality of bottom traces (e.g., 38 and 40, FIG. 2B) can be provided on panel P prior to singulation of individual components 30.

Vias 12 can be formed in panel P via etching, drilling, scribing, punching, forming in a green ceramic tape, or otherwise formed such that the vias penetrate internally and extend within a portion of panel P. In some aspects, vias 12 can be formed by laser drilling an already fired HTCC panel P.

Referring now to FIG. 1B, one or more LED chips 14 can be provided over panel P and supported thereby. As FIG. 1B illustrates, customized components having only one chip and components having multiple chips can optionally be provided over the same panel P, where desired. LED chips 14 can be spaced apart from the one or more traces 10. In some aspects, each LED chip 14 can have a clearance from it and/or around it such that there is no metallic trace close in proximity thereto. This can improve brightness and light extraction of light emitter components formed therefrom. In one example, traces 10 can be positioned a distance away from the closest LED chip 14 such that there is no metallic trace within at least 100 µm, within at least 200 µm or more, within 300 µm or more of LED chip 14.

In some aspects, at least one LED chip 14 is provided between each pair of traces 10. In some aspects, multiple LED chips 14 are provided between each pair of traces 10. LED chips 14 can electrically connect to each other in series between traces 10 via wirebonds 16. LED chips 14 can comprise anode/cathode contacts in the form of bond pads, designated BP. Bond pads BP are configured to electrically communicate with other chips and/or traces 10 via wirebonds 16. In further aspects, LED chips 14 can be wirebonded directly to traces 10 via wirebonds 16, and chips can be electrically connected in parallel therebetween. Any desired connectivity of LED chips 14, including combinations of serially and parallel connected chips, can be provided over panel P. The size, shape, structure, color, number, and/or connectivity of LED chips 14 provided between traces 10 can be customized for use in various lighting applications. Various combinations of LED chips 14 and phosphors/lumiphors can also be provided, for providing a desired color and light output from emitter components formed over panel P.

In some aspects, each pair of traces 10 can comprise first and second electrical contacts of opposing electrical polarity for passing electrical current into and out of one or more LED chips 14 causing illumination thereof. A single LED chip 14 can be provided between traces 10, or a plurality of chips can be provided between traces 10. Where multiple chips 14 are provided, chips 14 can be serially connected between traces 10, connected in parallel between traces 10, or combinations thereof. In some aspects, traces 10 can be fully disposed on a top side or top surface of panel P, and spaced apart from each other LED chip by a distance. FIGS. 1A to 1B illustrate providing a panel P, providing traces 10 over panel P, attaching LED chips 14 to panel P, and wirebonding LED chips 14 to each other and/or to traces 10 in series, in parallel, or any combination thereof. LED chips 14 can be attached to panel P, or portions thereof, via adhesive, solder, flux, metal, epoxy, silicone, or any other attachment method and/or material.

Still referring to FIG. 1B and in some aspects, an optical material M is applied over panel P, traces 10, and LED chips 14 after the LED chips 14 are die attached and/or wirebonded. An applicator or application tool $T_A$ can be used to apply optical material M to panel P via spraying, sprinkling, dripping, misting, spattering, brushing, painting, depositing, or any other suitable technique for applying optical material M in a uniform or non-uniform layer. In some aspects, the optical material M is sprayed directly panel P. More than one type of optical material M can be applied to panel P. In some aspects, optical material M can be applied in a single individual or discrete layer for covering panel P, traces 10, LED chips 14 and/or wirebonds 16. In other aspects, optical material M can be applied in multiple discrete layers over panel P, traces 10, LED chips 14 and/or wirebonds 16. Optical material M can be directly applied to panel P, traces 10, LED chips 14 and/or wirebonds 16. Optical material M can comprise a single type of optical conversion material, or more than one different types of optical conversion materials (e.g., adapted to emit different colors upon impingement of light by LED chips 14) for producing components having any desired color point or temperature. Optical material M can conformally coat and cover structure or components over which optical material M is applied. In other words, optical material M can, for example, provide a layer of optical conversion material conformally disposed over portions of each of the at least one light emitter chip and the first surface of the submount, as "conformally" herein means at least a coating that conforms to underlying or associated structures or surfaces, which may be irregularly shaped structures or surfaces.

In some aspects, optical material M is isolated within light emitter components to areas proximate the upper surface of panel P and/or over the LED chips 14 for improving thermal dissipation therefrom. Optical material M can advantageously confine heat directly over portions of panel P, such that it can more readily dissipate therefrom. Optical material M can comprise a separate layer within light emitter components according to the disclosure herein, which is neither dispersed within nor dispensed or formed at a same time as an optical element, such as a dispensed lens. Optical material M can also optionally cover one or more optional electrostatic protection devices (ESD) or chips (e.g., 34, FIG. 2A), where desired.

In some aspects, optical material M can comprise a material that is adapted to emit light of a specific color or wavelength in response to being impinged with light emitted by one or more LED chips 14. Optical material M can convert the light emitted by one or more LED chips 14 into light of any desired color. In some aspects, optical material M comprises a lumiphoric or phosphoric material adapted to emit red, green, yellow, white and/or blue light upon impingement of light from one or more primarily blue, green, or red LED chips 14.

Referring now to FIG. 1C, a plurality of optical elements, such as optical lenses or domes, generally designated 18 are formed over LED chips 14 (FIG. 1B), wirebonds 16 (FIG. 1B), and traces 10 (FIG. 1B). Optical elements 18 are formed over panel P, and as a separate layer with respect to optical material M. In some aspects, optical elements 18 are formed after application of one or more layers of optical material (e.g., M, FIG. 1B). In some aspects, optical elements 18 are disposed on a same side or surface of panel P to which LED chips 14 are mounted to, and/or a same side or surface to which traces 10 are deposited to. Optical material M and optical elements 18 are overlapping, however, each optical structure defines a separate, discrete and non-intermixed layer of material.

In some aspects, a plurality of optical elements 18 is formed over panel P at a same time. In some aspects, a high pressure mold or forming tool $T_F$ is used to mold a plurality of optical elements 18 or lenses over highly reflective ceramic panel P. Optical elements 18 are optionally heated and/or cured. In some aspects, optical elements 18 comprise any dispensable and/or moldable material, such as silicone, resin, epoxy, plastic, and/or any other polymeric material. Optical elements 18 can comprise any size and/or shape for providing any desired beam pattern or placement of light. In some aspects, the size, shape, and/or placement of optical elements 18 can be customized for use in different lighting applications. Optical elements 18 can comprise a molded lens having any size, material, and/or shape (e.g., sectional shape, and/or lens base shape).

For illustration purposes only, optical elements 18 having a substantially square lens base LB are illustrated, however, optical elements having substantially circular lens bases (e.g., hemispherical domes) can also be provided. Optical elements 18 can comprise any molded lens structure. Individual light emitter components, generally designated 30 (e.g., FIGS. 2A-2L) can be singulated from panel P upon singulation, for example, designated by singulation lines X and Y. Individual components 30 (e.g., FIGS. 2A-2L) can be separated from each other via sawing, breaking, dicing, shearing, scribing, machining, cutting, grinding, laser cutting, and/or combinations thereof.

Optical elements 18 can be transparent, semi-transparent, or opaque. Optional reflecting or light scattering particles can optionally be dispersed and/or molded within optical elements 18. As noted above however, optical elements 18 are devoid of optical conversion material, such as phosphoric or lumiphoric material (e.g., optical conversion material M, FIG. 1B) dispersed and/or molded therein. Panel P is reflective and comprises a primary reflector of light emitted from LED chips 14. One or more optional additional reflectors or reflective structures can optionally be provided, disposed, and/or formed over panel P.

An array of molded lenses, domes, or optical elements 18 can be molded, placed, or otherwise provided over panel P and a corresponding array of LED chips 14. In some aspects, traces 10 and LED chips 14 are provided on a front side of panel P, and SMD contacts (e.g., 38, 40, FIG. 2C) are provided on an opposing, back side of panel P. Traces 10 and/or ESD devices (e.g., 34, FIG. 2A) are provided proximate outermost edges of optical elements 18 for improving reflection from component submount S. A plurality of light emitter components 30 can be formed and easily manufactured via batch processing over panel P. Batch processes may include depositing traces 10, die attaching LED chips 14, wirebonding LED chips 14, applying and/or spraying optical material M (FIG. 1B), high pressure molding and curing optical elements 18, and/or singulating individual devices (e.g., 30, FIG. 2A).

FIGS. 1A to 1C collectively illustrate providing a panel P, providing traces 10 over panel P, attaching LED chips 14 to panel P, wirebonding LED chips 14 to each other and/or to traces 10, applying optical material M (i.e., over panel P, LED chips 14, traces 10, and/or wirebonds 16) providing optical elements 18 such as lenses over panel P and chips 14, and singulating individual components 30 from a plurality of components formed as a batch over panel P.

FIGS. 2A to 2L illustrate aspects of singulated, individual light emitter components 30. Notably, components 30 are devoid of a costly leadframe encased within molded plastic, but rather utilize thin electrically conductive traces 10 which can be customized with respect to size, shape, surface area, placement, layout, and/or electrical configuration with respect to LED chips 14 and bottom contacts (e.g., 38 and 40, FIG. 2B). Individual SMD light emitter components 30 can each comprise an individual submount S over which LED chips 14 are provided, where each submount S is a portion of panel P, which is singulated from panel P during a singulation process (e.g., sawing, dicing, laser cutting, shearing, breaking, etc.). Submount S can comprise any size, shape, and/or cross-sectional shapes. For illustration purposes, a substantially square overall shape with a substantially rectangular cross-sectional shape is illustrated, however, any other non-square and non-rectangular shape(s) can be provided.

Notably, a plurality of components 30 are formed over panel P of respective submounts S. As noted earlier with respect to FIG. 1C, panel P and respective submounts S comprise the building blocks of customized SMD type emitter components or packages described herein. For example, in some aspects, single or multi-chip components can be provided, components having any size, shape, and/or pattern of traces can be provided, and components having the same or differently colored LED chips 14 can be provided over and/or around portions of the panel P and respective submounts S. Customized optical elements 18 (e.g., size, shape, placement) can also be formed over and about LED chips 14, which can provide customized light and/or beam patterns. In some aspects according to the disclosure herein, a plurality of different customized components 30 can advantageously be provided without the expense of fabricating customized molded plastic leadframe components.

FIG. 2A depicts features disposed below optical element 18 in solid lines, however such features are present but may not be visible from the outside of component 30. For example, as the plurality of chips 14, traces 10, and/or wirebonds 16 can be covered with an optical material M, the chips may not be visible from the outside. For illustration purposes, optical material M is not shown in the perspective view illustrated by FIG. 2A as it may be difficult to distinguish the other features underlying optical element 18, however, optical material M is shown in the sectional view illustrated by FIG. 2D. Notably, optical material M and optical element 18 can each comprise separate and distinct layers of light emitter component 30.

In some aspects, a plurality of LED chips 14 can be electrically connected in series and/or parallel between traces 10. At least one pair of traces 10 is provided per component 30, where a first trace 10 is the anode and the other, second trace is the cathode. Together, the traces 10 supply electrical current to the chip or chips via wirebonds 16. Notably, traces 10, LED chips 14, ESD device 34, and wirebonds 16 can at least partially or fully be provided under, below, and/or within an optical material M and an optical element 18.

Submount S comprises a portion of panel P, and therefore comprises a non-metallic material. In some aspects, submount S comprises a ceramic based material, such as a transparent, semi-transparent, opaque, or otherwise highly reflective ceramic material for maximizing light extraction and reflectance. In some aspects, a submount according to any of the embodiments described herein can have a desirable thermal conductivity. For example and without limitation, submount S can have a thermal conductivity of greater than approximately 5 W/mK, greater than approximately 10 W/mK, greater than approximately 50 W/mK, greater than approximately 100 W/mK, greater than approximately 150 W/mK, or greater than approximately 200 W/mK. In more particular aspects, the thermal conductivity of the submount S can be approximately 20 W/mK (+ or −5 W/mK), such as for when the submount comprises alumina, or the thermal conductivity of the submount can be approximately 170 W/mK (+ or −5 W/mK), such as for when the submount comprises AlN.

Component 30 can further comprise at least one optional ESD protection device 34 electrically connected to traces 10 via one or more wirebonds 16. ESD protection device 34 is reversed biased with respect to LED chips 14. ESD protection device 34 can comprise a vertical device that is reversed biased or electrically connected in reverse polarity to LED chips 14. ESD protection device 34 can, for example, comprise a vertical silicon (Si) Zener diode, a dual back-to-back Zener diode, a different LED chip arranged in parallel and reverse biased to LED chip 14, a surface mount varistor, and/or a lateral Si diode.

ESD protection device 34 can be mounted using any known material and/or technique. ESD protection device 34 can be smaller than LED chips 14 such that it does not cover an excessive area on the surface of the submount S and such that it does not block and/or absorb a significant amount of light. ESD protection device 34 can prevent excessive current from passing through component 30 from an ESD event by providing an alternative path for current flow besides the LED chips 14. Notably, traces 10 and ESD protection device 34 can be confined to outermost edges of submount S for reducing blockage and/or interference with light.

Figure 2C:
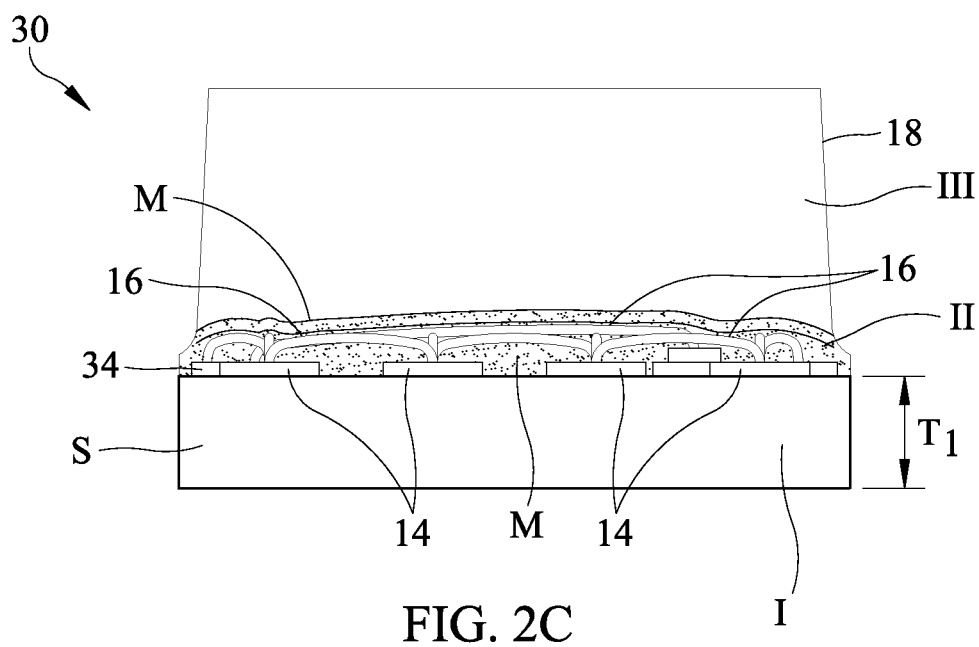
FIG. 2C is a sectional view illustrating a singulated submount based light emitter component according to the disclosure herein.

In generally, the dimensions of submount S are illustrated in FIGS. 2B and 2C. Referring to FIG. 2B, submount S can have a length L2 and width W2 of approximately 3.5 mm×3.5 mm, and/or a surface area of approximately 12.25 mm². As noted above however, any size and/or shape of submount S can be provided (e.g., where L2 or W2 is approximately 10 mm or less, where L2 or W2 is approximately 7 mm or less, where L2 or W2 is approximately 5 mm or less, or where L2 or W2 is approximately 2 mm or less, etc.). Referring to FIG. 2C, submount S can be any thickness T1, such as between approximately 0.35 and 1.0 mm thick. In some aspects, T1 comprises approximately 0.6 mm, or 0.635 mm. Submount S can also comprise a thickness T1 that is greater than 1.0 mm (e.g., 2.0 mm, 3.0 mm, etc.), where desired. As noted above, any size and/or shape of substrate S can be provided.

Referring to FIG. 2A and in some aspects, traces 10 comprise a small surface area relative to the top surface area (e.g., L2×W2) of submount S. For example, traces 10, taken together, can comprise a total surface area of less than approximately less than approximately 10% of the surface area of submount S (e.g., less than approximately 1.225 mm² total surface area), less than approximately 7% of the surface area of submount S (e.g., less than approximately 0.85 mm² total surface area), or less than approximately 5% of the surface area of submount S (e.g., less than approximately 0.6125 mm² total surface area).

Traces 10 can comprise one more layers of copper (Cu), titanium (Ti), nickel (Ni), Ag, electroless Ag, Au, electroless nickel immersion gold (ENIG), Sn, palladium (Pd), electrolytic or immersion Au, or another other material which can be applied via a deposition process, such as physical or plasma deposition, sputtering, e-beam or, electroplating, and/or electroless plating processes. Different layers of metals can be applied or coated in layers over each other. For example, a layer of Ti can be deposited directly over submount S and can be coated with one or more layers of Ag and Cu. In other aspects, different and/or alternating metallic layers can be applied over submount S. In some aspects, traces 10 comprise at least one layer of reflective Ag, either alone or in combination with layers of Ti, Ni, Cu, and/or Au.

Referring to FIG. 2B and in some aspects, component 30 further comprises first and second electrical contacts 38 and 40 disposed on a bottom surface of submount S. First and second contacts 38 and 40 are separated from each other by an insulating member 42, comprised of an electrically insulating material. Contacts 38 and 40 comprise SMD pads or contacts configured to electrically communicate with an external circuit, and, optionally thermally communicate with an external heat sink. In some aspects, the circuit is also the heat sink. In other aspects, the heat sink and circuit can comprise separate components.

First and second contacts 38 and 40 on a rear surface of submount S are configured to electrically communicate with traces 10 on a front surface of submount S by the one or more internally disposed thru-holes or vias 12. Vias 12 can extend internally within a portion of submount S depending upon on how placed within panel (e.g., FIG. 1A) and how panel is subdivided into individual submounts S. For example, vias 12 can be fully internal to, intact, and/or fully contained within portions of submount S as shown, or in other aspects, vias 12 can be apportioned and exposed such that they are disposed along one or more external sides of submount S. Vias 12 can comprise conduits for transferring electrical current between first and second top contacts 38 and 40 and respective traces 10. Thus, vias 12 also comprise conduits for passing electrical current to and from LED chip 14 within component 30.

In some aspects, first and second contacts 38 and 40 can comprise metallic bodies or portions of electrically conductive material that can be attached to submount S via adhesive, solder, glue, epoxy, paste, silicone, or any other material. In other aspects, first and second contacts 38 and 40 can comprise metallic bodies or portions of material that can be pressed into a green ceramic tape and then co-fired with submount S. In other yet further aspects, first and second contacts 36 and 38 can be applied to submount S via a conductive paste screen-printed over an HTCC panel P (e.g., FIGS. 1A-1C) and fired. In some aspects, a conductive Ag paste can be used.

FIG. 2C is a sectional view of light emitter component 30. Light emitter component 30 comprises at least three discrete layers of material, designated I, II, and III. A first layer of material I comprises a non-molded and non-metallic submount S over which traces 10 and one or more LED 14 chips are provided. A second layer of material II comprises optical material M, such as an optical conversion material. Optical material M can comprise at least one discrete layer of at least one phosphoric or lumiphoric material which is sprayed or otherwise applied over component 30 prior to high-pressure molding optical element 18. In some aspects, optical material M can be sprayed directly on the reflective ceramic submount, but again any suitable application may be used, such as any suitable application wherein the layer of optical material M is a non-dispensed layer. In further aspects, optical material M can comprise multiple layers of multiple phosphoric or lumiphoric materials. The third discrete layer of material is optical element 18. Notably, optical element 18 is devoid of phosphoric or lumiphoric material dispersed therein. A third layer of material III can comprise an optically clear, transparent, semi-transparent, or opaque layer of material defining optical element 18. Optical element 18 can comprise any substantially clear, transparent, semi-transparent, or opaque layer of material, such as silicone, which is molded and cured over submount S and optical material M. Optical element 18 can comprise any size or shape, in some aspects, as substantial square shaped lens or a hemispherical lens. Each discrete layer I, II, and III can comprise a material having a discrete thickness and location within component 30.

Figure 2D:
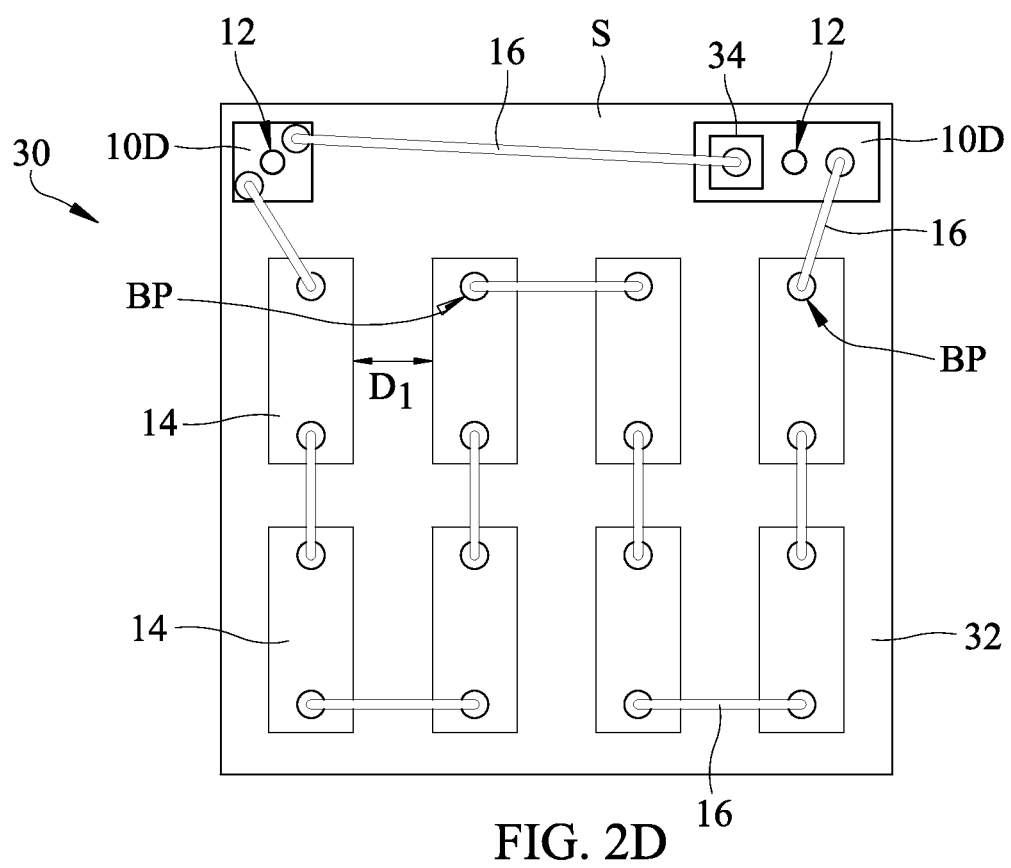
FIGS. 2D to 2L are top plan views illustrating various examples of light emitter chip layouts for submount based light emitter components according to the disclosure herein.

FIGS. 2D to 2L illustrate various embodiments of trace 10 and LED chip 14 placement or layout within component 30. LED chips 14 comprise horizontal chips, with both positive and negative contacts disposed on an upper surface thereof. Other chip structures, including contacts on the bottom or vertical chips having top/bottom contacts can be provided. LED chip 14 can comprise substantially straight-cut lateral sides or beveled (e.g., sloped or inclined) lateral sides and can comprise any shape, size, dimension, structure, build, and/or color. In some aspects, LED chips 14 can comprise a growth or carrier substrate comprised of sapphire. As FIG. 2D illustrates LED chips 14 can be serially connected between traces 10. LED chips 14 can also be connected in parallel between traces 10. In some aspects, one or more strings of serially connected LED chips 14 can be connected in parallel between traces 10.

In some aspects, only a single LED chip 14 can be provided between traces 10 (e.g., FIG. 1B). However, in other aspects multiple chips 14 can be provided over and/or supported by submount S between traces 10 for achieving a higher brightness than can be emitted by a single chip. LED chips 14 can be disposed proximate a center of submount S and/or distributed across at least 30%, 40%, 50%, or more than 60% of the surface area of submount S. LED chips 14 can be provided at equal distances from each other, or randomly spaced apart. In some aspects, LED chips 14 are spaced apart from each other by at least approximately 50 µm or more, at least approximately 100 µm or more, at least approximately 200 µm or more, at least approximately 300 µm or more, at least approximately 400 µm or more, or more than 500 µm apart. In some aspects, LED chips are spaced apart from each other by about 190 µm.

Figure 2E:
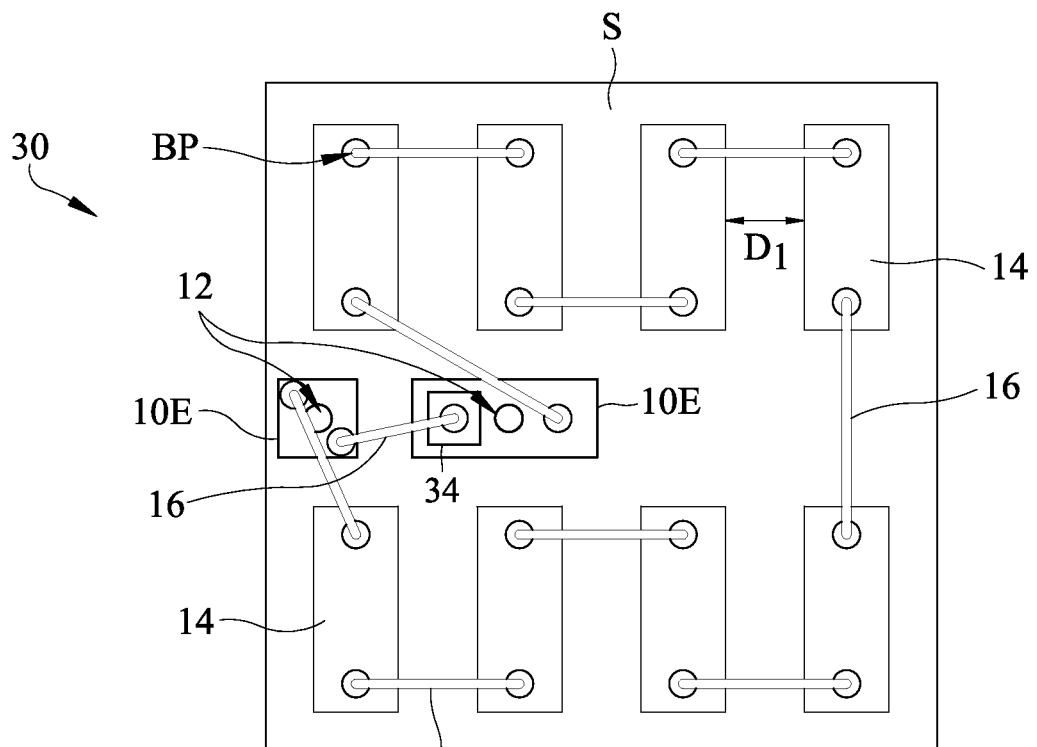
Figure 2F:
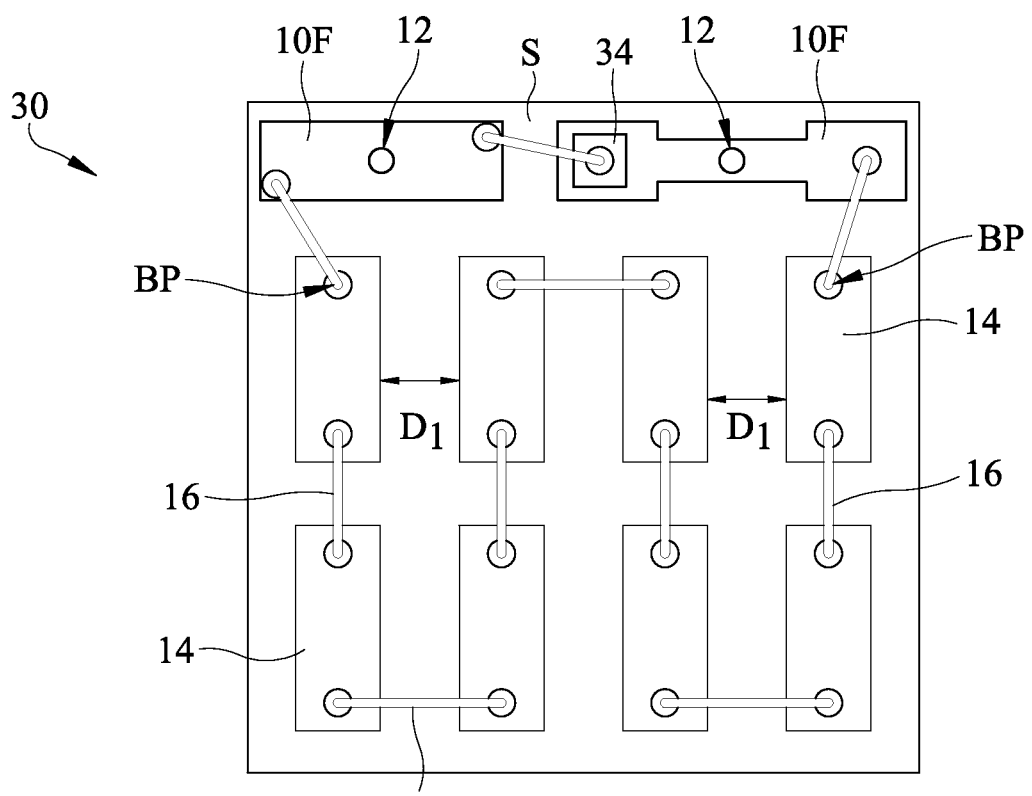

FIGS. 2D, 2E, and 2F illustrate smaller and/or thinner LED chips 14 (e.g., as compared to FIGS. 2G to 2L) having a first LED chip spacing D1. LED chips 14 can comprise any length and/or width, such as, for example, comprise a footprint where at least one side (e.g., a length or width) measures approximately 500 µm or less, such as approximately 400 µm or less, approximately 300 µm or less, approximately 200 µm or less, approximately 100 µm or less, approximately 50 µm or less. FIGS. 2D, 2D, and 2F illustrate embodiments of component 30, where a total amount of chip area is less than or approximately equal to 20% of the overall surface area (e.g., L2×W2, FIG. 2B) of submount S. Any dimension of LED chip(s) 14 can be provided.

In some aspects, chip spacing D1 in FIGS. 2D, 2E, and 2F can comprise less than or approximately 200 µm, less than or approximately 100 µm, less than or approximately 80 µm, or less than or approximately 50 µm. In some aspects, FIGS. 2D, 2E, and 2F each utilize eight serially connected LED chips 14 where an overall LED chip 14 surface area is approximately 20% of the overall submount S surface area (e.g., calculated as L2×W2, FIG. 2B). The size, placement, layout, and/or location of traces 10 in each respective figure (e.g., FIGS. 2D-2F) can be different. For example, in FIG. 2D, traces 10D are disposed proximate the corners or edges of submount S. In FIG. 2E, traces 10E are disposed proximate a center of submount S. The combined surface area of traces 10D and 10E in FIGS. 2D and 2E, respectively, is less than approximately 5% of the overall surface area of submount S. In FIG. 2F, traces 10F can be disposed proximate one edge of submount S. Traces 10F are slightly larger than utilized in FIGS. 2D and 2E, and can comprise a combined surface area of less than approximately 7% of the overall surface area of submount S.

Figure 2G:
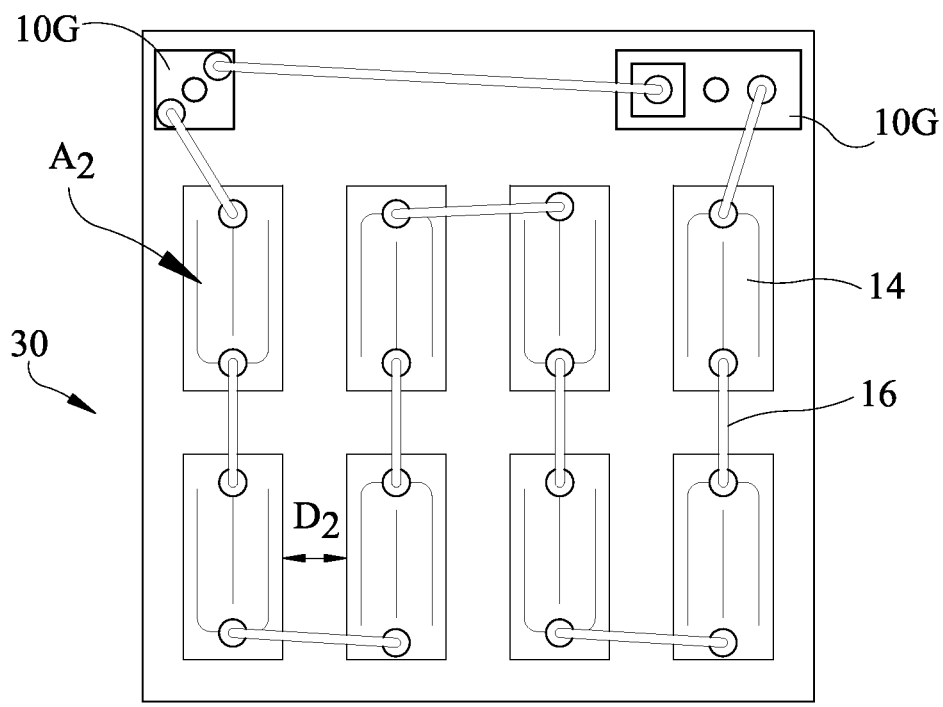
Figure 2H:
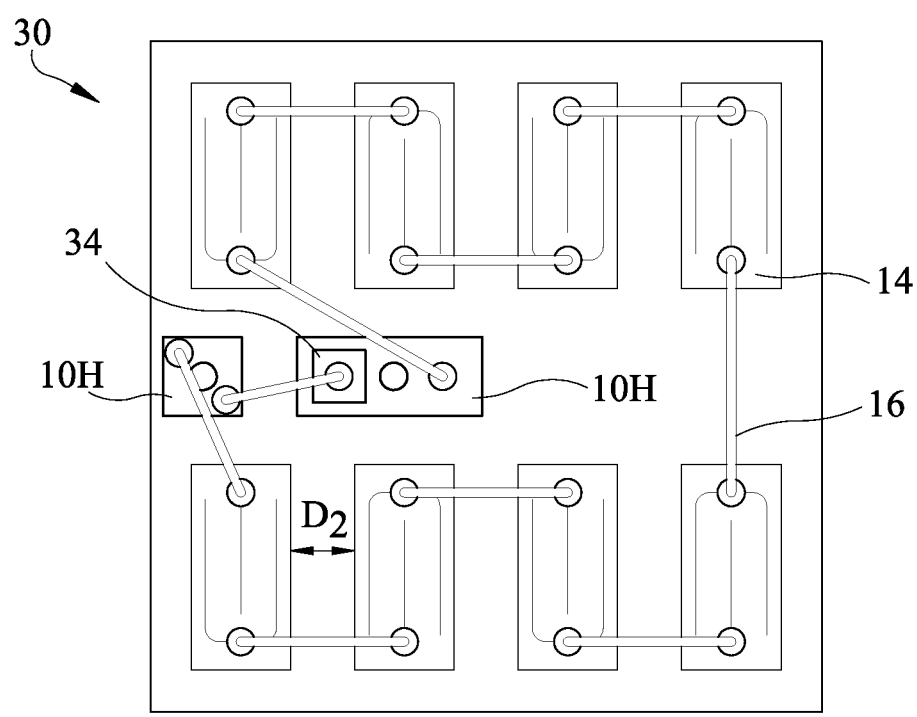
Figure 2I:
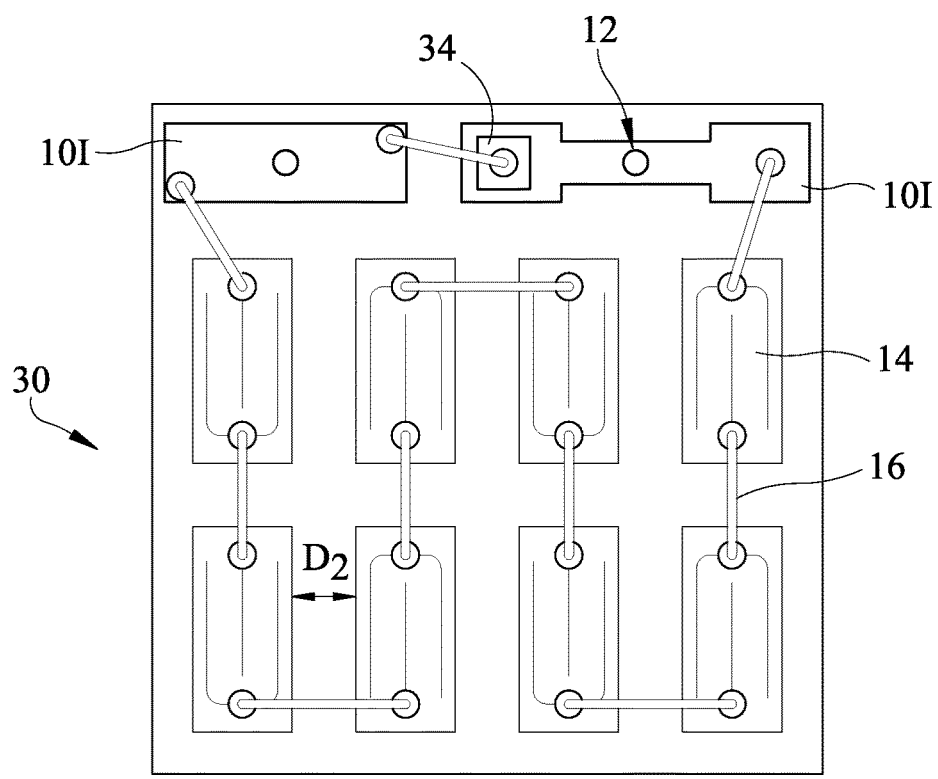

FIGS. 2G, 2H, and 2I illustrate larger and/or thicker LED chips 14 (e.g., as compared to FIGS. 2D to 2F) having a second LED chip spacing D2. Larger chips may be required for lighting applications having more lumens per Watt (LPW) or operability at higher voltages. LED chips 14 can have any length and/or width, such as for example, a footprint where at least one side (e.g., a length or width) measures approximately 1000 µm or less, such as approximately 500 µm or less, approximately 400 µm or less, approximately 300 µm or less, approximately 200 µm or less, approximately 100 µm or less. FIGS. 2G, 2H, and 2I illustrate embodiments of component 30, where a total amount of chip area (e.g., a sum of each chip area A2, FIG. 2G) is less than or approximately equal to 35% of the overall surface area (e.g., L2×W2) of submount S. Any dimension of LED chip(s) 14 can be provided.

In some aspects, second chip spacing D2 in FIGS. 2G, 2H, and 2I can comprise less than or approximately 100 µm, less than or approximately 80 µm, less than or approximately 60 µm, or less than or approximately 50 µm.

In some aspects, FIGS. 2G, 2H, and 2I each utilize eight serially connected LED chips 14 where an overall LED chip 14 surface area is approximately 35% of the overall submount S surface area (e.g., calculated as L2×W2, FIG. 2B). The size, placement, layout, and/or location of traces 10 in each respective figure (e.g., FIGS. 2G-2I) can be different. For example, in FIG. 2G, traces 10G are disposed proximate the corners or opposing outermost edges of submount S. In FIG. 2H, traces 10H are disposed proximate a center of submount S. The combined surface area of traces 10G and 10H in FIGS. 2G and 2H, respectively, is less than approximately 5% of the overall surface area of submount S. In FIG. 2I, traces 10F can be disposed proximate one edge of submount S. Traces 10I are slightly larger or longer than utilized in FIGS. 2G and 2H, and can comprise a combined surface area of less than approximately 7% of the overall surface area of submount S.

Figure 2J:
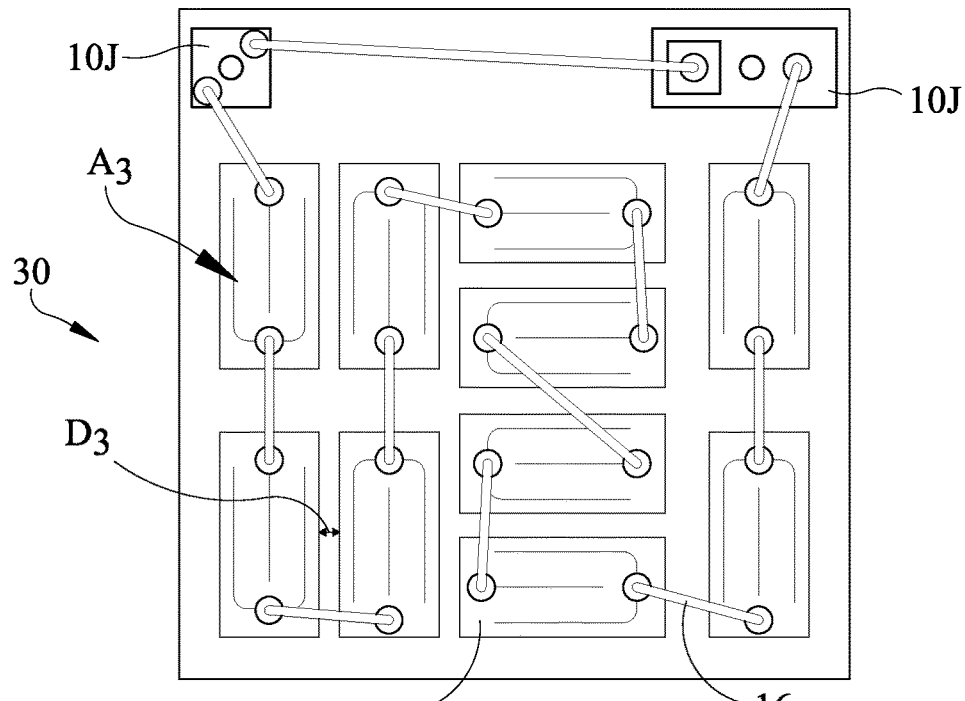
Figure 2K:
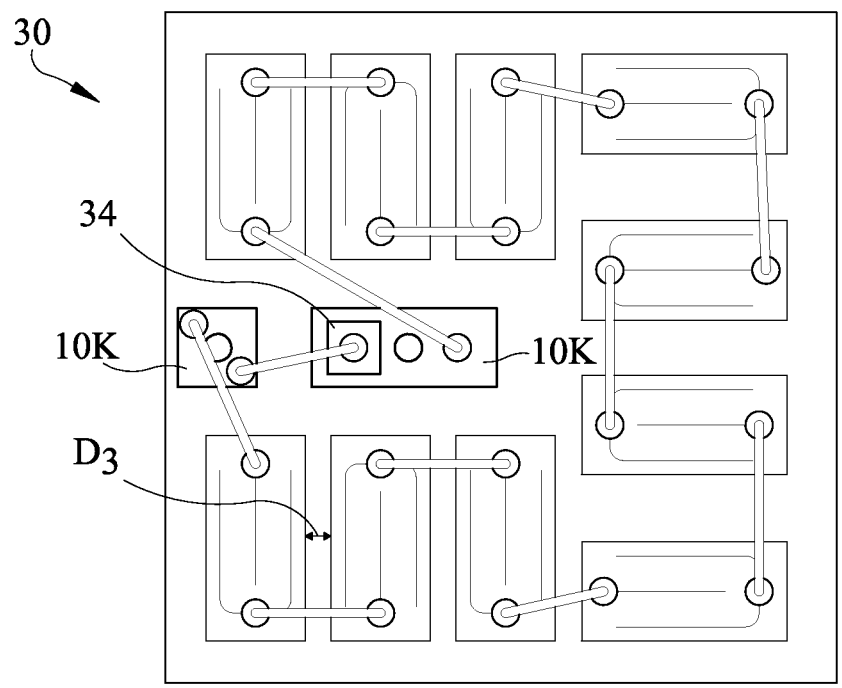
Figure 2L:
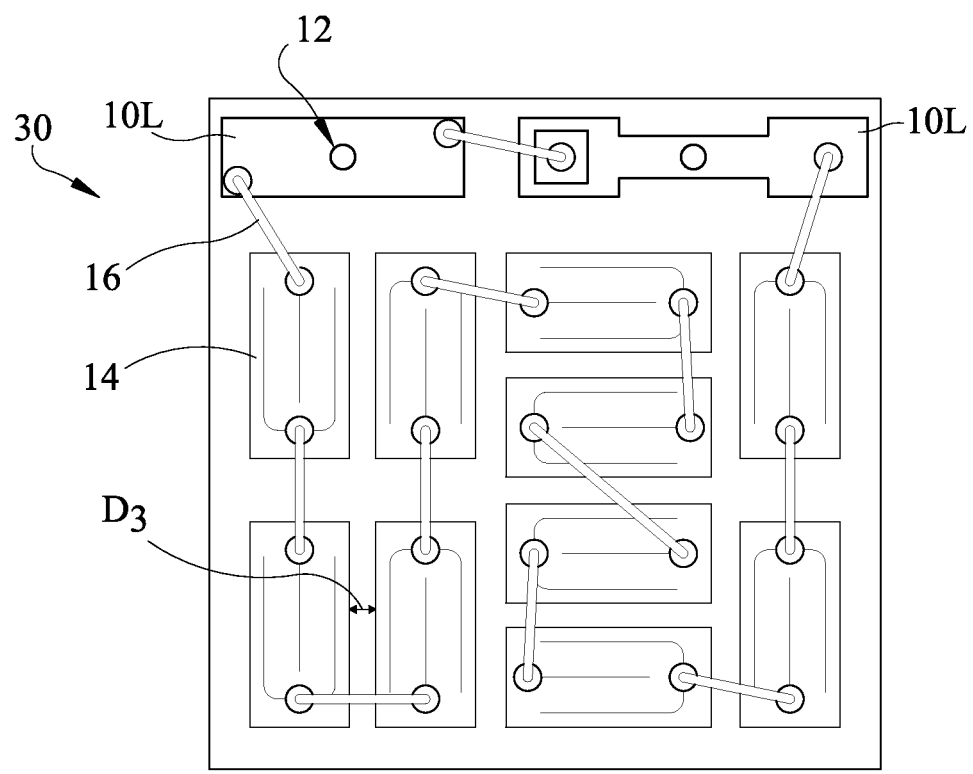

The size and/or number of LED chips 14 can vary depending upon the desired output or operability of component 30. FIGS. 2J, 2K, and 2L can use 10 LED chips 14. FIGS. 2J, 2K, and 2L have a third LED chip spacing D3, which is smaller or tighter than first and second chip spacing D1 and D2. A larger number chips may be necessary for lighting applications operable at higher voltages. Although components 30 having 8 and 10 LED chips 14 are illustrated, more or less than 10 chips can be provided. For example, 5 chips can be provided per component 30, 12 chips can be provided per component 30, 16 chips can be provided per component 30, or more than 20 chips can be provided per component 30.

LED chips 14 can comprise any length and/or width, such as, for example, comprise a footprint where at least one side (e.g., a length or width) measures approximately 2000 µm or less, such as approximately 1000 µm or less, approximately 500 µm or less, approximately 300 µm or less, approximately 250 µm or less, or approximately 100 µm or less. FIGS. 2J, 2K, and 2L illustrate embodiments of component 30, where a total amount of chip area (e.g., a sum of each chip area A3, FIG. 2J) is less than or approximately equal to 45% of the overall surface area (e.g., L2×W2) of submount S. Any dimension of LED chip(s) 14 can be provided. In some aspects, chip spacing D3 in FIGS. 2J, 2K, and 2L can be less than or approximately 80 µm, less than or approximately 70 µm, less than or approximately 60 µm, less than or approximately 50 µm, or less than or approximately equal to 40 µm.

In some aspects, FIGS. 2J, 2K, and 2L each utilize 10 serially connected LED chips 14 where an overall LED chip 14 surface area is approximately 45% of the overall submount S surface area (e.g., calculated as L2×W2, FIG. 2B). The size, placement, layout, and/or location of traces 10 in each respective figure (e.g., FIGS. 2J-2L) can be different. For example, in FIG. 2J, traces 10J are disposed proximate the corners or opposing outermost edges of submount S. In FIG. 2K, traces 10K are disposed proximate a center of submount S. The combined surface area of traces 10J and 10K in FIGS. 2J and 2K, respectively, is less than approximately 5% of the overall surface area of submount S. In FIG. 2L, traces 10L can be disposed proximate one edge of submount S. Traces 10L are slightly larger or longer than utilized in FIGS. 2G and 2H, and can comprise a combined surface area of less than approximately 7% of the overall surface area of submount S.

As FIGS. 2D to 2L illustrate, LED chips 14 are mounted over various portions of submount S. Notably, there is no metal (i.e., and no metallic traces 10) in the die attach areas, as defined as areas between LED chips 14 as bounded by wirebonds 16 serially connecting groups of LED chips. In addition, LED chips 14 are not disposed over plated metal, but rather over submount S, comprised of ceramic. Multiple LED chips 14, where provided, can be configured to emit a same color of light, or different colors of light. LED chips 14 of component 30 as illustrated by FIGS. 2A to 2L can be configured to emit light that is primarily blue, blue shifted yellow (BSY), cyan, green, red, yellow, red-orange, orange, amber, and/or white. Any color of LED chip 14 can be provided. LED chips 14 can be configured to activate a yellow, red, and/or green phosphor, for example, in a discrete layer of optical material M for producing cool and/or warm white output.

In further embodiments, one or more primarily red LED chips 14 can be included in emitter component 30 and can be used alone and/or combination with one or more BSY chips 14. In some aspects, a red LED chip 14 can also optionally be disposed below optical material M and/or optical element 18 (FIG. 2D) for mixing to produce warm white output.

Component 30 is customizable for operability at any suitable voltage such as voltage between approximately 3 volts (V) and 72V. That is, component 30 can be configured with performance-specific numbers, size, and/or layout of LED chips 14, vias 12, and/or top/bottom contacts 38 and 40 for operability at 3V; 9V; 12V; 18V; 24V; 30V; 36V; 48V; and 72V. Component 30 is configured to deliver at least 50 lumens per Watt (LPW) or more, at least 100 LPW or more; at least 110 LPW or more; or more than 160 LPW.

In some aspects, component 30 is configured to emit white light having a reference point on the blackbody locus (e.g., 1931 CIE Chromaticity Diagram) having a color temperature of less than or approximately equal to 5000 K, less than or approximately equal to 4000 K, less than or approximately equal to 3500 K, less than or approximately equal to 3000 K, or less than or approximately equal to 2700 K. In some aspects, combined emissions from component 30 embodies a color rendering index (CRI Ra) value of at least 70, at least 75, at least 80 (e.g., 82 or 85), or at least 90 or more.

Figure 3A:
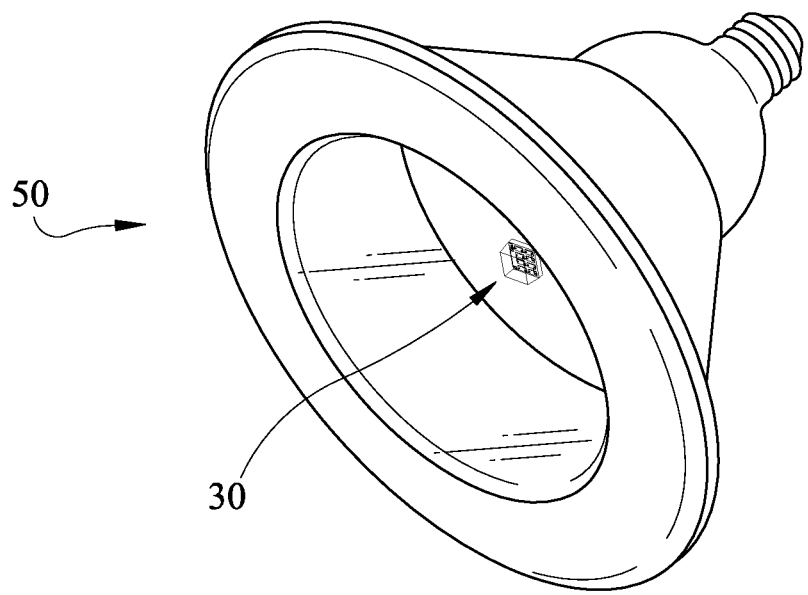
FIGS. 3A and 3B illustrate a light fixture and a light bulb, respectively, incorporating a submount based light emitter component according to the disclosure herein.
Figure 3B:
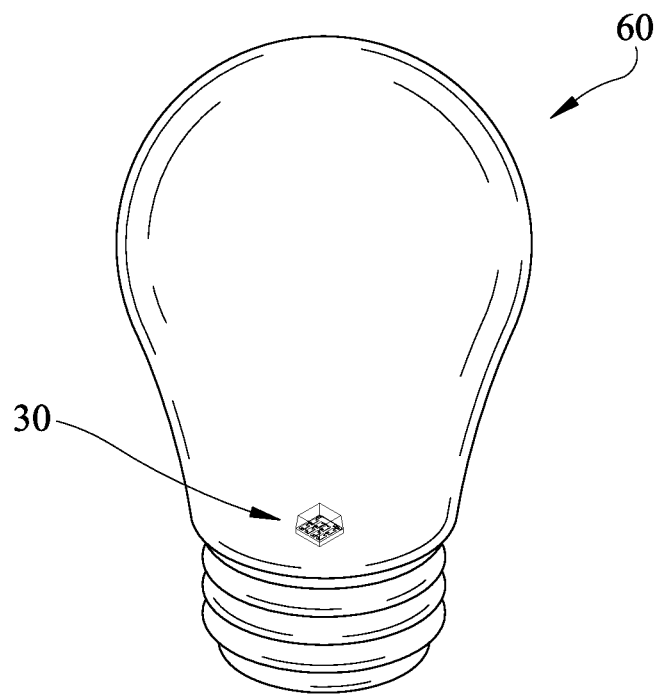

FIGS. 3A and 3B are a lighting fixture and lighting bulb, respectively, generally designated 50 and 60. Lighting fixture 50 and bulb 60 can incorporate one or more light emitter components 30. Lighting fixture 50 can incorporate at least one component 30 therein. In some aspects, multiple components 30 can be disposed within a single lighting fixture 50. Lighting fixture 50 can comprise a down light or a can light. Any style of lighting fixture can be provided, and fixtures for different lighting applications can be provided.

Lighting fixture 50 can deliver at least 50 LPW or more, at least 100 LPW or more, at least 110 LPW or more, or more than 160 LPW. In some aspects, lighting fixture is configured to emit white light having a reference point on the blackbody locus (e.g., 1931 CIE Chromaticity Diagram) having a color temperature of less than or approximately equal to 5000 K, less than or approximately equal to 4000 K, less than or approximately equal to 3500 K, less than or approximately equal to 3000 K, or less than or approximately equal to 2700 K. In some aspects, combined emissions from fixture 50 embodies a color rendering index (CRI Ra) value of at least 70, at least 75, at least 80 (e.g., 82 or 85), or at least 90 or more. Lighting fixture 50 can also be dimmable via a triac dimmer circuit, where desired.

Lighting bulb 60 can comprise any size, shape, and/or type of bulb available on the market. For illustration purposes, an A19 bulb (e.g., as defined by ANSI Standard C.78.20-2003) is shown, however, any other type of light bulb can incorporate one or more light emitter components 30 as described hereinabove. Bulb 60 is configured for operation at approximately 40 LPW or more, approximately 60 LPW or more, or approximately 100 LPW or more.

Customized emitter components described herein can be easily produced as the time consuming process and additional cost associated providing customized packages or components (e.g., customized molded plastic bodies and/or cavities) becomes obsolete. A multitude of different customized components, having customized colors, brightness, voltage, power, layout, sizes, and/or shapes can be provided without the expense of creating custom fabricated components and/or leadframe components.

Embodiments as disclosed herein may provide one or more of the following beneficial technical effects: reduced cost of providing light emitter components; reduced processing time; improved light reflection; improved light extraction; improved brightness; improved LPW per power density; improved manufacturability of light emitter components; improved ability to vary component features, such as trace design and layout, number of LED chips, and custom optical elements.

While the components and methods have been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitter component comprising:
   a reflective ceramic submount;
   one or more electrical traces on a first surface of the submount, wherein the first surface of the submount is oriented in a plane of uncovered ceramic material that passes through uppermost horizontal edges of the submount, and wherein the one or more electrical traces are spaced apart from the uppermost horizontal edges of the submount that define the first surface of the submount;
   at least one light emitted chip attached to the first surface of the submount, wherein the at least one light emitter chip is electrically connected to the one or more electrical traces, and wherein the at least one light emitter chip is spaced apart from the one or more electrical traces;
   a single continuous layer of optical conversion material disposed over and in contact with at least portions of each of the at least one light emitter chip and the first surface of the submount; and a lens attached over the layer of optical conversion material, wherein the layer of optical conversion material and the lens are separate and discrete layers over the at least one light emitter chip and submount, and wherein the lens comprises a substantially circular or square lens base, the lens base being a portion of the lens which is attached to the first surface of the submount, and the lens base extending to the uppermost horizontal edges of the submount that define the first surface of the submount.

2. The component of claim 1, wherein the submount comprises highly reflective alumina.

3. The component of claim 1, wherein the submount comprises zirconia.

4. The component of claim 1, wherein the layer of optical conversion material is a non-dispensed layer.

5. The component of claim 1, wherein the lens is a molded lens.

6. The component of claim 1, wherein the submount comprises a plurality of reflective particles selected from the group consisting of titanium dioxide ($TiO_2$), zinc peroxide ($ZnO_2$), silicon dioxide ($SiO_2$), and zirconia ($ZrO_2$) particles.

7. The component of claim 1, wherein the one or more electrical traces comprise a pair of electrical traces disposed over the submount.

8. The component of claim 7, wherein a combined surface area of the pair of electrical traces is less than or equal to approximately 7% of a surface area of the first surface.

9. The component of claim 7, wherein a combined surface area of the pair of electrical traces is less than or equal to approximately 5% of a surface area of the first surface.

10. The component of claim 1, wherein the at least one light emitter chip comprises a plurality of light emitter chips.

11. The component of claim 10, wherein a combined surface area of the plurality of light emitter chips is less than or equal to approximately 45% of a surface area of the first surface.

12. The component of claim 10, wherein a combined surface area of the plurality of light emitter chips is less than or equal to approximately 35% of a surface area of the first surface.

13. The component of claim 10, wherein a combined surface area of the plurality of light emitter chips is less than or equal to approximately 20% of a surface area of the first surface.

14. The component of claim 10, wherein the plurality of light emitter chips are serially connected.

15. The component of claim 1, wherein the optical conversion material comprises one or more phosphors.

16. The component of claim 1, wherein the lens has sides and a top that are substantially planar.

17. A light emitter component comprising:
a reflective ceramic submount;
one or more electrical traces on a first surface of the submount, wherein the first surface of the submount is oriented in a plane of uncovered ceramic material between outermost that passes through uppermost horizontal edges of the submount, and wherein the one or more electrical traces are spaced apart from the uppermost horizontal edges of the submount that define the first surface of the submount;
at least one light emitted chip attached to the first surface of the submount, wherein the at least one light emitter chip is electrically connected to the one or more electrical traces, and wherein the at least one light emitter chip is spaced apart from the one or more electrical traces;
a single continuous layer of optical conversion material conformally disposed over and contacting portions of each of the at least one light emitter chip and the first surface of the submount.

18. The component of claim 17, wherein the at least one light emitter chip is mounted directly on the submount.

19. A method of providing one or more light emitter component, the method comprising:
providing a reflective ceramic submount;
depositing one or more electrical traces on a first surface of the submount, wherein the first surface of the submount is oriented in a plane of uncovered ceramic material that passes through uppermost horizontal edges of the submount, and wherein the one or more electrical traces are spaced apart from the uppermost horizontal edges of the submount that define the first surface of the submount;
attaching at least one light emitter chip to the first surface of the submount, wherein the at least one light emitter chip is spaced apart from the one or more electrical traces;
electrically connecting the at least one light emitter chip to the one or more electrical traces;
applying a single continuous layer of optical conversion material over and in contact with at least portions of each of the at least one light emitter chip and the first surface of the submount; and
attaching a lens over the layer of optical conversion material,
wherein the layer of optical conversion material and the lens are separate and discrete layers over the at least one light emitter chip and submount, and
wherein the lens comprises a substantially circular or square lens base, the lens base being a portion of the lens attached to the first surface of the submount, and the lens base extending to the uppermost horizontal edges of the submount that define the first surface of the submount.

20. The method of claim 19, wherein the submount comprises highly reflective alumina.

21. The method of claim 19, wherein the submount comprises zirconia.

22. The method of claim 19, wherein applying the single continuous layer of optical conversion material comprises spraying the optical conversion material over the submount and light emitter chips.

23. The method of claim 19, wherein depositing one or more electrical traces over the submount comprises depositing at least one pair of electrical traces over the submount, and wherein wirebonding the at least one light emitter chip to the one or more electrical traces comprises wirebonding the at least one light emitter chip to the at least one pair of electrical traces.

24. The method of claim 23, wherein a combined surface area of the pair of electrical traces is less than or equal to approximately 7% of a surface area of the first surface.

25. The method of claim 23, wherein a combined surface area of the pair of electrical traces is less than or equal to approximately 5% of a surface area of the first surface.

26. The method of claim 19, wherein the light emitter chip is directly attached to the submount.

27. The method of claim 19, wherein attaching the lens over the layer of optical conversion material comprises molding the lens over the layer of optical conversion material.

28. The method of claim 19, wherein the lens has sides and a top that are substantially planar.

29. A method of providing one or more light emitter component, the method comprising:
- providing a reflective ceramic submount;
- depositing one or more electrical traces over a first surface of the submount, wherein the first surface of the submount is oriented in a plane of uncovered ceramic material that passes through uppermost horizontal edges of the submount, and wherein the one or more electrical traces are spaced apart from the uppermost horizontal edges of the submount that define the first surface of the submount;
- attaching at least one light emitter chip to the first surface of the submount, wherein the at least one light emitter chip is spaced apart from the one or more electrical traces;
- electrically connecting the at least one light emitter chip to the one or more electrical traces; and
- spraying a single continuous layer of optical conversion material over and in contact with at least portions of each of the at least one light emitter chip and the first surface of the submount.

30. The method of claim 29, wherein the optical conversion material is sprayed directly on the submount.

* * * * *